United States Patent
Song et al.

(10) Patent No.: US 10,187,053 B1
(45) Date of Patent: Jan. 22, 2019

(54) DRIVE CIRCUIT FOR POWER SEMICONDUCTOR DEVICES

(71) Applicant: SEMICONDUCTOR COMPONENTS INDUSTRIES, LLC, Phoenix, AZ (US)

(72) Inventors: Kinam Song, Seoul (KR); Wonhi Oh, Bucheon (KR); Jinkyu Choi, Bucheon (KR); JunHo Lee, Bucheon (KR); Seunghyun Hong, Seoul (KR)

(73) Assignee: Semiconductor Components Industries, LLC, Phoenix, AZ (US)

(*) Notice: Subject to any disclaimer, the term of this patent is extended or adjusted under 35 U.S.C. 154(b) by 0 days.

(21) Appl. No.: 15/657,406

(22) Filed: Jul. 24, 2017

(51) Int. Cl.
*H03K 17/284* (2006.01)
*H03K 17/687* (2006.01)
*H03K 17/08* (2006.01)

(52) U.S. Cl.
CPC ........... *H03K 17/284* (2013.01); *H03K 17/08* (2013.01); *H03K 17/6871* (2013.01)

(58) Field of Classification Search
USPC ......................................... 327/108–112, 427
See application file for complete search history.

(56) References Cited

U.S. PATENT DOCUMENTS

| | | | |
|---|---|---|---|
| 5,514,981 A | 5/1996 | Tam et al. | |
| 7,236,020 B1 | 6/2007 | Virgil | |
| 2008/0018364 A1* | 1/2008 | Clarkin | H02M 1/08 327/110 |
| 2009/0140708 A1* | 6/2009 | Tateishi | H02M 3/1588 323/282 |
| 2010/0148741 A1* | 6/2010 | Chen | H02M 3/158 323/285 |
| 2012/0126736 A1* | 5/2012 | Leung | H03K 17/063 318/400.28 |
| 2012/0133420 A1* | 5/2012 | Draxelmayr | H02M 3/337 327/430 |
| 2015/0035584 A1* | 2/2015 | Fujita | H03K 17/163 327/384 |
| 2017/0264184 A1* | 9/2017 | Tezuka | H03K 17/687 |
| 2017/0353099 A1* | 12/2017 | Yang | H02M 1/08 |
| 2018/0123495 A1* | 5/2018 | Baurle | H02H 7/0805 |

* cited by examiner

*Primary Examiner* — Adam Houston
(74) *Attorney, Agent, or Firm* — Brake Hughes Bellermann LLP

(57) ABSTRACT

In a general aspect, an apparatus can include a low-side drive circuit configured to control a low-side device of a power semiconductor device pair and a high-side drive circuit configured to control a high-side device of the power semiconductor device pair. The high-side drive circuit can include an input circuit configured to receive an input signal and produce, based on the input signal, a first control signal, from which a latch set signal is produced to turn on the high-side device, and a second control signal, from which a latch reset signal is produced to turn off the high-side device. The high-side drive circuit can further include an overlap-prevention circuit configured to prevent timing overlap between the second control signal and a voltage-recovery period of the high-voltage circuit, where the voltage-recovery period occurs after turning off the high-side device of the power semiconductor device pair.

20 Claims, 5 Drawing Sheets

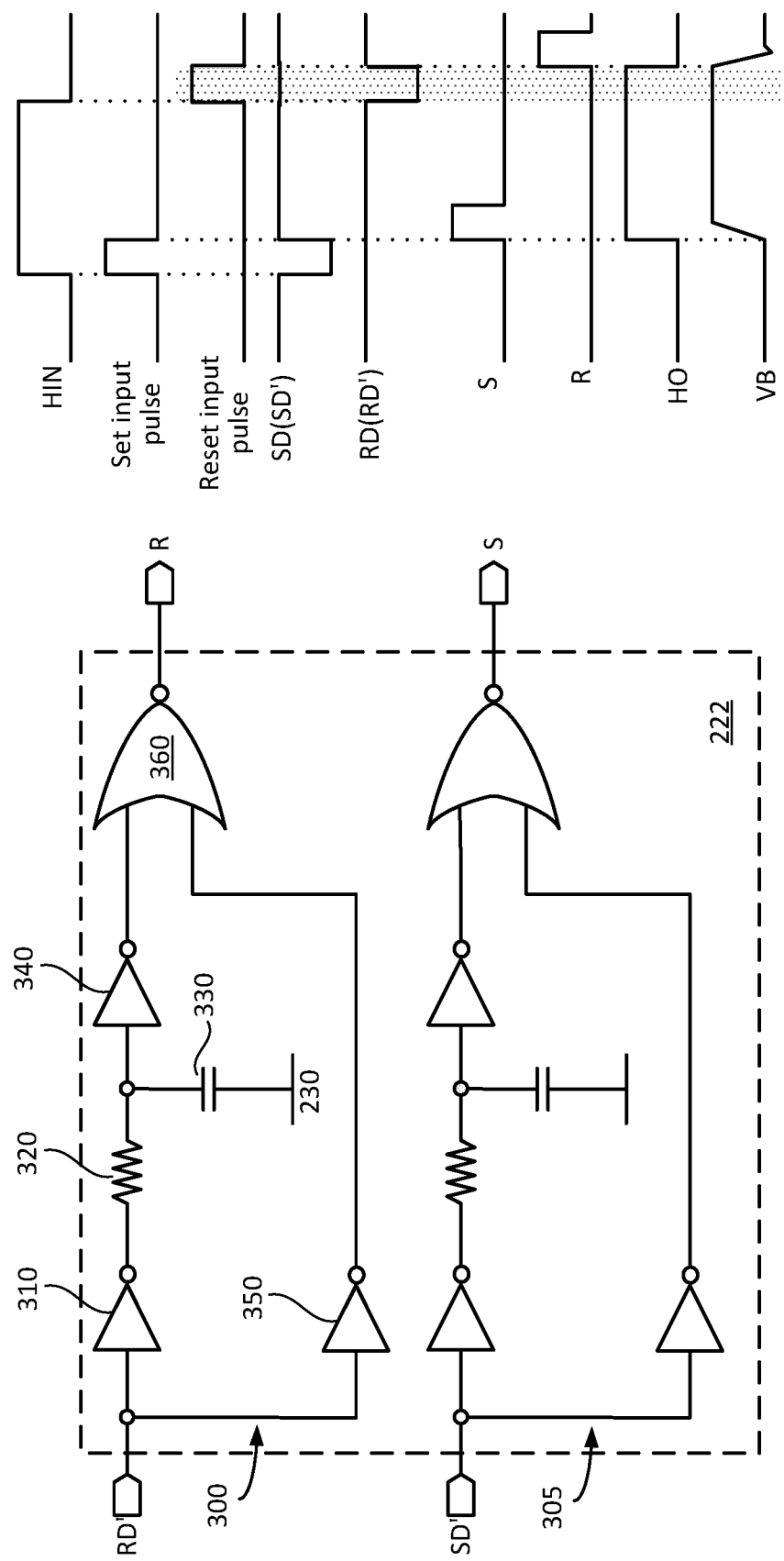

DRIVE CIRCUIT FOR POWER SEMICONDUCTOR DEVICES

TECHNICAL FIELD

This description relates to approaches for controlling (e.g., driving control terminals of) power semiconductor devices. In particular, the description relates to approaches for driving power semiconductor device pairs (e.g., semiconductor device pairs including a low-side device and a high-side device).

BACKGROUND

Power semiconductor device pairs, such as those including a high-side power semiconductor device and a low-side power semiconductor device, are used in a number of high-voltage circuit applications. For instance, such power semiconductor device pairs can be used in power converters, automotive applications, industrial applications, telecommunications applications, etc. Drive circuits (also referred to as control circuits) for controlling such power semiconductor device pairs can be susceptible (e.g., as a result of operating conditions, electrical noise, etc.) to so-called "latch-on" failure, where both power semiconductor devices are undesirably turned on at the same time, which results in cross-conduction (e.g., simultaneous current conduction through both the high-side device and low-side device). Such cross-conduction, as a result of latch-on failure, can cause catastrophic damage to both the high-side and low-side power-semiconductor devices, such as power semiconductor devices implemented in a high-voltage integrated circuit (HVIC).

SUMMARY

In a general aspect, an apparatus can include a low-side drive circuit configured to control a low-side device of a power semiconductor device pair, and a high-side drive circuit configured to control a high-side device of the power semiconductor device pair. The high-side drive circuit can include an input circuit configured to receive an input signal, and produce, based on the input signal, a first control signal and a second control signal. The high-side drive circuit can also include a high-voltage circuit configured to, in response to the first control signal, provide a set signal to turn on the high-side device of the power semiconductor device pair, and, in response to the second control signal, provide a reset signal to turn off the high-side device of the power semiconductor device pair. The high-voltage circuit can include an overlap-prevention circuit configured to prevent timing overlap between the second control signal and a voltage-recovery period of the high-voltage circuit. The voltage-recovery period can occur after turning off the high-side device of the power semiconductor device pair.

BRIEF DESCRIPTION OF THE DRAWINGS

FIG. 3 is a schematic diagram of an edge-trigger circuit that can be implemented in the circuits of FIGS. 1 and 2, in accordance with an implementation.

FIG. 4 is a timing diagram illustrating operation of the high-side drive circuit of FIG. 2.

Like reference symbols in the various drawings indicate like and/or similar elements.

DETAILED DESCRIPTION

Figure 1:
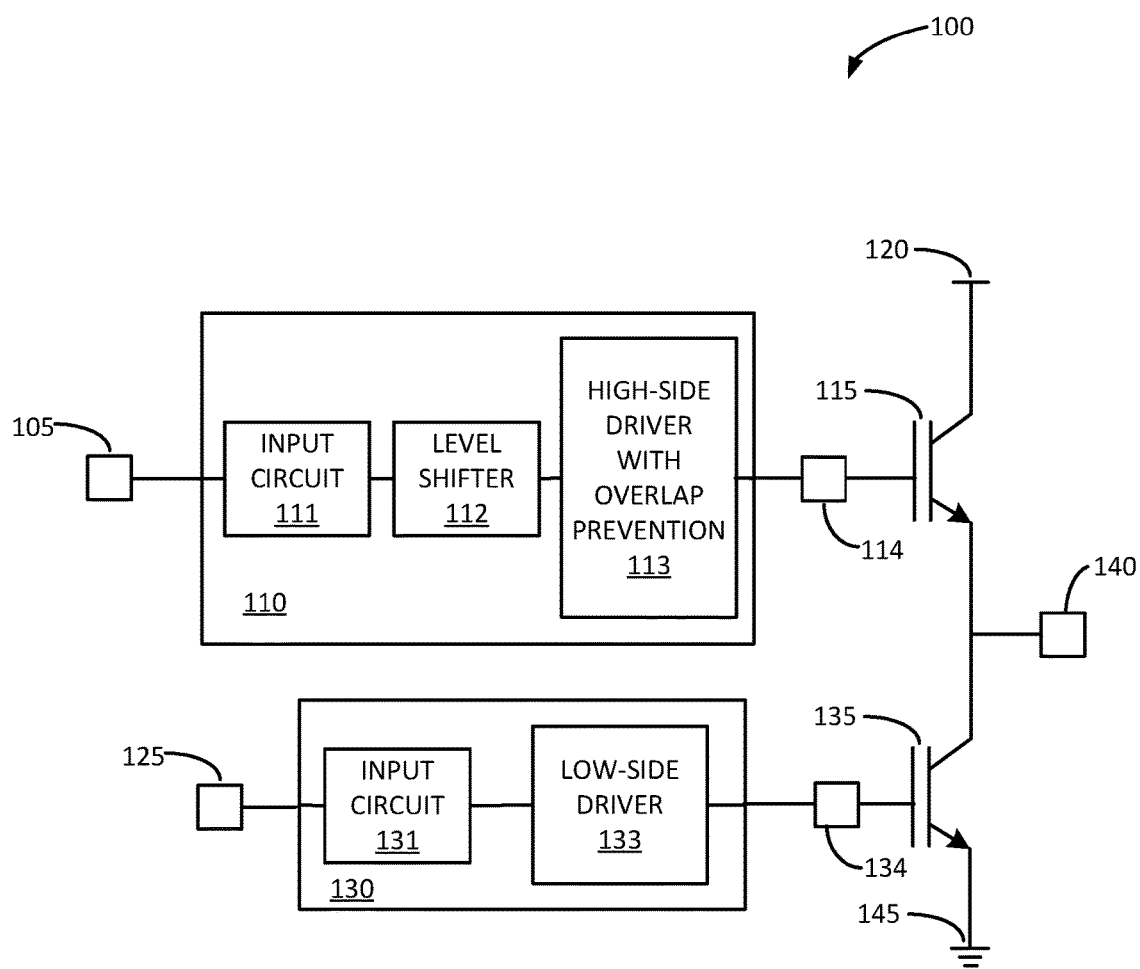
FIG. 1 is a block diagram of a power semiconductor circuit, in accordance with an implementation.

FIG. 1 is a block diagram of a power semiconductor circuit (circuit) 100, in accordance with an implementation. The circuit 100 includes a pair of power semiconductor devices (power semiconductor device pair) including a high-side insulated-gate bipolar transistor (IGBT) 115 and a low-side IGBT 135. The circuit 100 also includes a low-side drive circuit 130 that can be used to control (switch, etc.) the low-side IGBT 135 by providing a low-side output signal on a low-side output terminal 134. As shown in FIG. 1, the low-side output terminal 134 can be coupled with a gate terminal of the IGBT 135.

The low-side output signal (on terminal 134) can be provided by the low-side drive circuit 130 in response to a low-side input signal that is applied to a low-side input terminal 125. In the circuit 100, the low-side drive circuit 130 includes an input circuit 131 and a low-side driver 133. The input circuit 131 can include, for example, biasing components (e.g., a pull-down resistor, etc.), an input buffer (e.g., a Schmitt trigger) and a pulse generator that is used to generate control pulses (e.g., a set input pulse and a reset input pulse for application, directly or indirectly, to a latch included in the low-side driver 133). The control pulses produced by the input circuit 131 can be based on the low-side input signal applied to the terminal 125. While not specifically shown, the low-side driver 133 can include a noise canceller, a set-reset (SR) latch (or other latch device) and a signal buffer (amplifier).

The circuit 100 further includes a high-side drive circuit 110 that can be used to control (switch, etc.) the high-side IGBT 115 by providing a high-side output signal on a high-side output terminal 114 that is coupled with a gate terminal of the IGBT 115. The high-side output signal (on terminal 114) can be provided by the high-side drive circuit 110 in response to a high-side input signal that is applied to a high-side input terminal 105. In certain implementations, the low-side input signal and the high-side input signal can be separate signals, can be a same input signal, or can be based on the same input signal. For instance, the low-side input signal can be an inverted version of the high-side input signal, or vice versa.

As shown in FIG. 1, a collector terminal of the IGBT 115 can be connected to a high-voltage supply terminal 120. Depending on the implementation, a voltage applied to the high voltage supply terminal could be, e.g., 100 volts (V), 200 V, 300 V, etc. Further, in the circuit 100, an emitter terminal of the IGBT 115 and a collector terminal of the IGBT 135 are coupled with an output terminal 140 of the power semiconductor device pair of the circuit 100. While not specifically shown in FIG. 1, the high voltage supply terminal 120, as well as an offset voltage supply can be coupled with the high-side drive circuit 110, where a potential difference between the high voltage supply and the offset voltage supply can be used to power, at least some of, the components of the high-side drive circuit 110 (e.g., where the offset supply voltage acts as a ground supply voltage for high-voltage components the high-side drive circuit 110 powered by/from the high-voltage supply terminal 120). A low-voltage supply voltage can also be coupled with the high-side drive circuit 110. In an example implementation, a voltage applied to the high voltage supply terminal 120 can be 100 V and an offset voltage could be in a range of 90-95 V, result in a potential difference with the high voltage supply and offset voltage supply of 5-10 V.

In the circuit 100, the high-side drive circuit 110 includes an input circuit 111 (e.g., powered by a low-voltage supply), a level shifter circuit 112 (e.g., powered by a high-voltage supply) and a high-side driver 113 (e.g., powered by a high-voltage supply) that includes an overlap prevention circuit. As with the input circuit 131, the input circuit 111 can include, for example, biasing components (e.g., a pull-down resistor, etc.), an input buffer (e.g., a Schmitt trigger) and a pulse generator that is used to generate control pulses (e.g., a set input pulse and a reset input pulse for application (e.g., through the level-shifter circuit 112) to a latch included in the high-side driver 113) The control pulses can be based on the high-side input signal applied to the terminal 105. The level shifter circuit 112 can be configured to shift the set input pulse (which can be referred to, in this example, as a first control signal) and the reset input pulse (which can be referred to, in this example, as a second control signal) from respective low-voltage signals to respective high-voltage signals.

Figure 2:
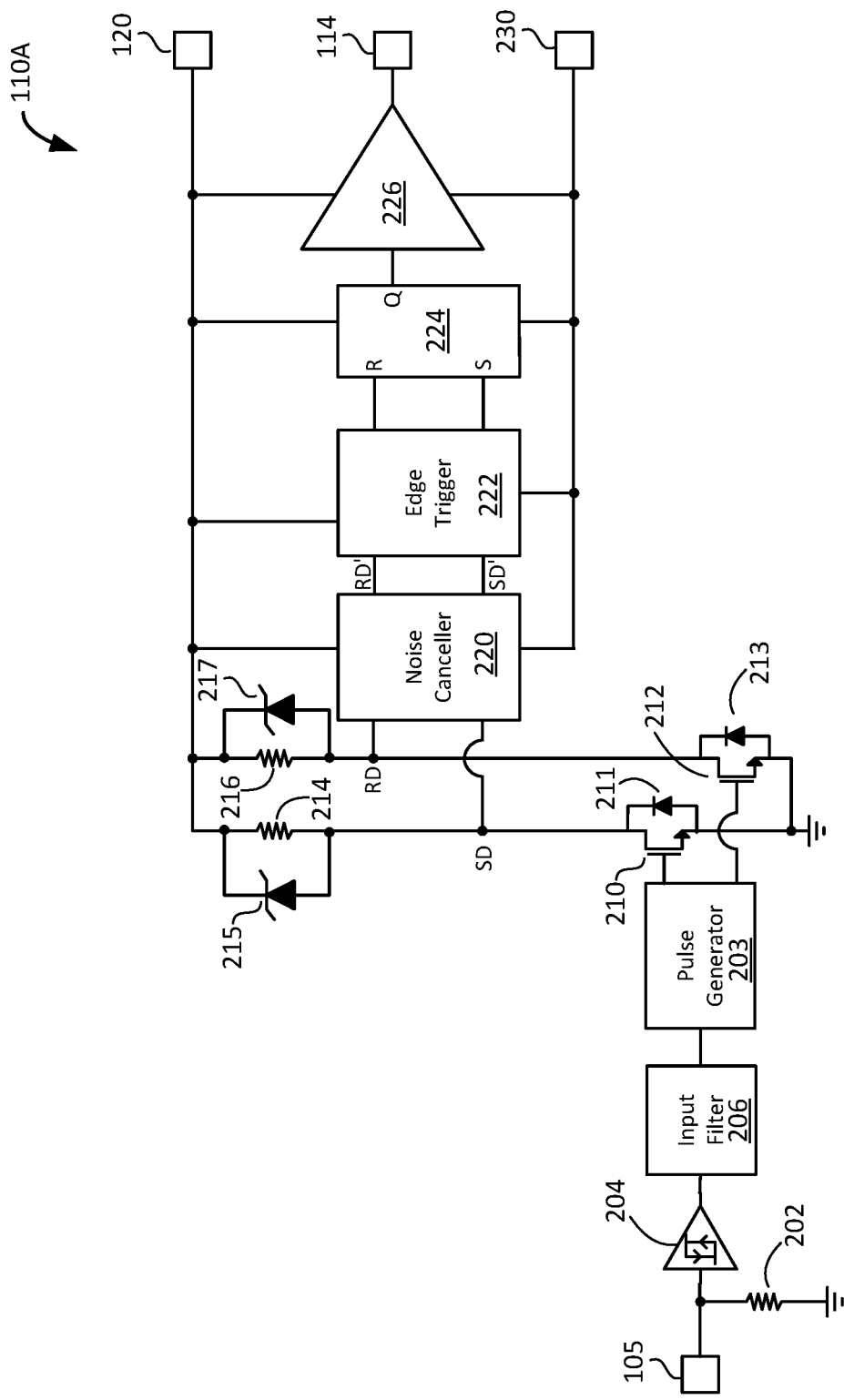
FIG. 2 is a block/schematic diagram of a high-side drive circuit that can be implemented in the circuit of FIG. 1, in accordance with an implementation.
Figure 5:
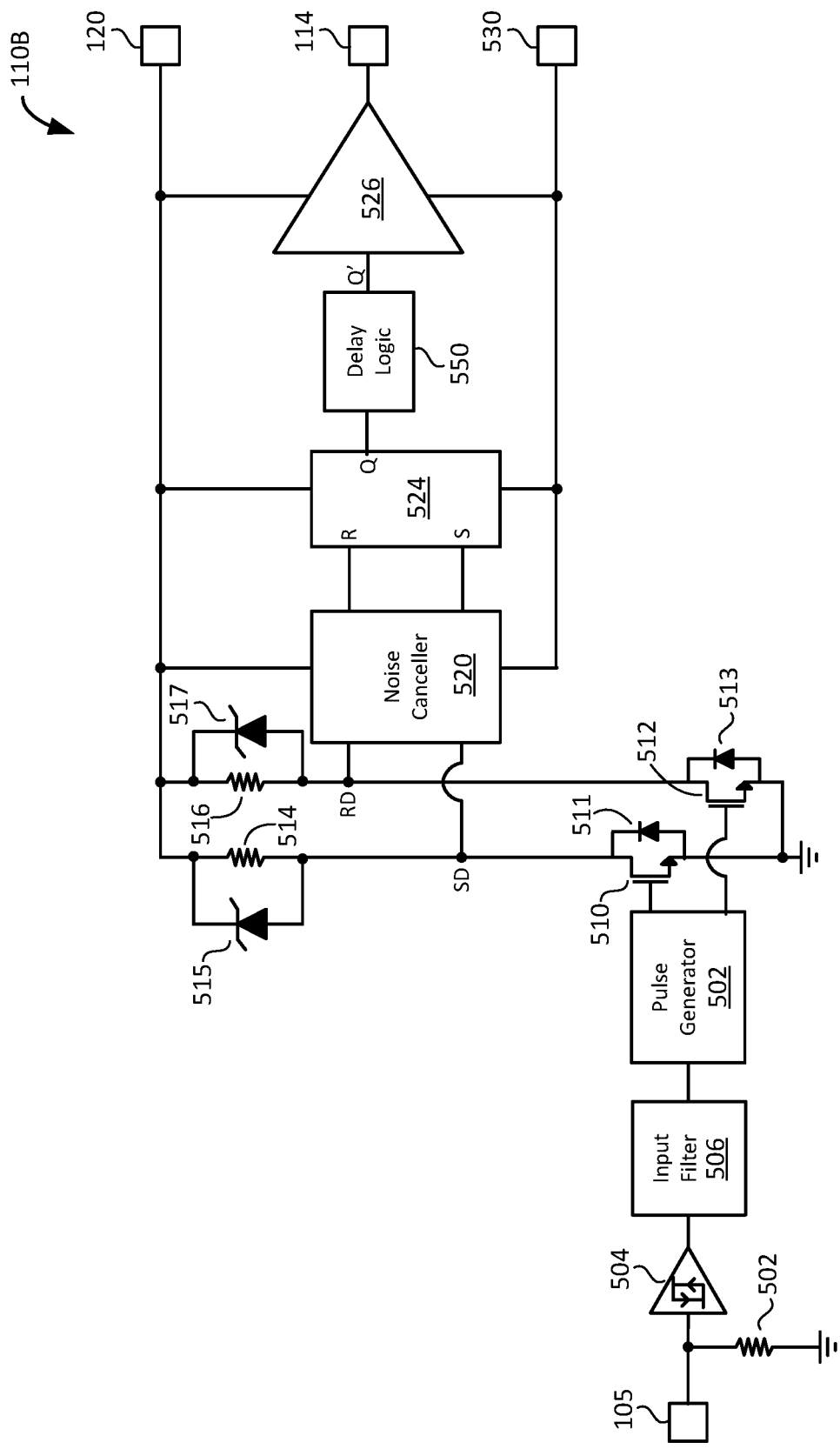
FIG. 5 is a block/schematic diagram of another high-side drive circuit that can be implemented in the circuit of FIG. 1, in accordance with an implementation.

Example implementations of the high-side drive circuit 110 (as circuit 110A and 110B), including example implementations of the input circuit 111, the level shifter circuit 112 and the high-side driver 113 are shown in FIGS. 2 and 5 and described below. Example overlap protection circuits of the circuits of FIGS. 2 and 5 are illustrated, respectively, in FIGS. 3 and 6 and also described below. Briefly, however, an overlap protection circuit of the high-side driver 113 can prevent occurrence of the above-described latch-on failure. For instance, in implementations, such as those described herein, an overlap protection circuit can be configured to prevent latch-on failure by preventing timing overlap between the reset input pulse (e.g., generated by the input circuit 111 and applied, via at least the level shifter circuit 112, to a reset input of a latch of the high-side driver circuit 113) and a voltage-recovery period of the high-voltage circuit, where the voltage-recovery period occurs after turning off the high-side device of the power semiconductor device pair.

As discussed in further detail below, overlap between the reset input pulse (and an associated latch reset signal) and the voltage-recovery period (high voltage recovery) can cause an unwanted set signal (e.g., applied to the latch of the high-side drive circuit 113), which can result in both a high-side power semiconductor device and a low-side power-semiconductor device of a power semiconductor device pair to turn at the same time, resulting in cross-conduction and latch on failure, which can cause catastrophic damage to a circuit (e.g., integrated circuit, etc.) that includes the power semiconductor device pair.

FIG. 2 is a block/schematic diagram of a high-side drive circuit 110A that can be implemented in the circuit 100 of FIG. 1, in accordance with an implementation. For instance, the circuit 110A, shown in FIG. 2, can be implemented as the high-side drive circuit 110 of the circuit 100. Accordingly, for purposes of illustration, the circuit 110A will be described with further reference to FIG. 1 and like elements in FIGS. 1 and 2 are referenced with like reference numbers. For instance, the circuit 110A includes the high-side input terminal 105, the high-voltage supply terminal 120 and the high-side output terminal 114.

In the circuit 110A, the input circuit 111 of the circuit 100 can include a pull-down resistor 202 (e.g., as a biasing element), a Schmitt trigger 204, an input (noise) filter 206 and a pulse generator 208. As noted above, the pulse generator 208 can be configured to generate a set input pulse (e.g., first control signal) and a reset input pulse (e.g., second control signal) from a high-side input signal. For instance, in an implementation, the set input pulse can be generated in response to a rising (or falling) edge of the high-side input signal on the terminal 105, while the reset input pulse can be generated in response to a falling (or rising) edge of the high-side input signal. That is, the set input pulse and the reset input pulse can be produced in response to opposite (rising and falling) edges of a high-side input signal on the terminal 105.

In the circuit 110A, the level shifter circuit 112 of the circuit 100 can include a first (set) transistor 210 coupled with the pulse generator 208 and a second (reset) transistor 212 coupled with the pulse generator 208. As shown in FIG. 2, the transistors 210 and 212 can be N-type metal-oxide-semiconductor field effect transistors (N-MOSFETs), such as laterally diffused transistors. For purposes of illustration, and for reference in the discussion below regarding high-voltage recovery and occurrence of latch-on failure, respective body diodes 211 and 213 of the transistors 210 and 212 are shown in FIG. 2. In the circuit 110A, the body diodes 211 and 213 can be bulk (intrinsic) diodes of the transistors 210 and 212, respectively.

In the circuit 110A, the level shifter circuit 112 of the circuit 100 can also include a first (set) pull-up resistor 214, a first transient blocking (zener) diode 215, a second (reset) pull-up resistor 216, and a second transient blocking (zener) diode 217. The diodes 215 and 217 can block high voltage transients from the high-voltage supply terminal 120, such as may occur when the high-side IGBT 115 is switched in response to the high-side output signal on the terminal 114.

When implemented with the circuit 110A, the high-side driver circuit 113 of the circuit 100 can include a noise canceller 220, an edge trigger 222 (which acts as the overlap protection circuit in this example), a SR latch 224 and a signal buffer/driver 226. In the circuit 100, implemented with the circuit 110A as the high-side drive circuit 110, the level shifter 112 and the high-side driver 113, as shown in FIG. 2, are powered (operated by) a potential difference between the high-voltage supply terminal 120 and the offset voltage supply terminal 230, such as was discussed above.

In the circuit 110A, the set transistor 210 can be configured, in conjunction with the set pull-up resistor 214, to generate a set input signal that is provided to the high-side driver 133, e.g., in the circuit 100, where the set input signal is produced by switching the set transistor 210 with the set input pulse produced by the pulse generator 208. The set input signal can (via the noise canceller 220 and the edge trigger 222) set the SR latch 224 (set the output Q of the SR latch 224 to logic 1 in response to a rising edge on the set input (S) of the SR latch 224), which will turn on the high-side IGBT 115 in the circuit 100.

Likewise, the reset transistor 212 of the circuit 110A can be configured to generate a reset input signal for the high-side driver 133, e.g., in the circuit 100, where the reset input signal is produced by switching the reset transistor 212 with the reset input pulse produced by the pulse generator 208. The reset input signal can (via the noise canceller 220 and the edge trigger 222) reset the SR latch 224 (set the output Q of the SR latch 224 to logic 0 in response to a rising edge on the reset input (R) of the SR latch 224), which will turn off the high-side IGBT 115 in the circuit 100.

In the high-side drive circuit 110A, the edge trigger 222 (which can include, in this example, two edge trigger circuits, such as in the implementation of FIG. 3) can generate a reset signal that is applied to the reset input R of the SR latch 224 in a response to a rising edge of the reset input signal provided by the level shifter 112 (via the noise canceller 220), where the level shifter 112 provides a reset input signal RD (which is a level-shifted version of the reset input pulse) to noise canceller 220 and the noise canceller 220 provides a noise filtered version RD' of the reset input signal to the edge trigger 222. In this example, both versions of the reset input signal (RD and RD') are inverted versions of the reset input pulse produced by the pulse generator 208. Any timing difference between the versions of the reset input signal RD and RD' (e.g., due to propagation delay in the noise canceller 220) should be negligible.

In the circuit 110A, the edge trigger 222 can also generate a set input pulse that is applied to the set input S of the SR latch 224 in a response to a rising edge of the set input signal provided by the level shifter 112 (via the noise canceller 220), where the level shifter 112 provides a set input signal SD (which is a level-shifted version of the set input pulse) to noise canceller 220 and the noise canceller 220 provides a noise filtered version SD' of the set input signal to the edge trigger 222. In this example, both versions of the set input signal (SD and SD') are inverted versions of the set input pulse produced by the pulse generator 208. Any timing difference between the versions of the set input signal SD and SD' (e.g., due to propagation delay in the noise canceller 220) should be negligible.

Use of the edge trigger 222 to produce the reset signal R for the SR latch 224 from the noise filtered version RD' of the reset input signal prevents timing overlap between the reset input pulse in the level shifter 112 and a voltage-recovery period of the high-voltage supply terminal 120 (e.g., after the switching off the high-side IGBT). Use of the edge trigger 222 to produce the set signal S for the SR latch 224 from the noise filtered version SD' of the set input maintains consistent timing between the high-side input signal (on terminal 105), the set input signal versions (SD and SD' generated in response to a rising edge of the high-side input signal) and the reset input signal versions (RD and RD' generated in response to a falling edge of the high-side input signal). A timing diagram illustrating example timing of the circuit 100 of FIG. 1 when implemented using the circuit 110A of FIG. 2 as the high-side drive circuit 110 is shown in FIG. 4, and discussed in further detail below. In certain implementations, the edge trigger 222 could produce the set signal S and the reset signal R based on falling edges of, respectively, the noise filtered set and reset input signals, SD' and RD'.

In a circuit including a power semiconductor device pair, such as the circuit 100, without an overlap protection circuit, timing overlap can occur between a reset input pulse produced by a pulse generator (such as the pulse generator 208) and a high-voltage recovery period, where the high-voltage recovery period occurs when the high-side output signal (e.g., on the terminal 114) goes from logic 1 to logic 0, turning off the high-side IGBT and causing a large transient on the high-voltage supply terminal 120 due to a change in collector current of the IGBT 115 as a result of the IGBT 115 being turned off.

This timing overlap can cause an unwanted (spurious, transient, etc.) set control signal (SD) to be generated by the level shifter 112. For example, such an unwanted set signal control signal SD can be generated during overlaps of the reset input pulse and the high-voltage recovery period due, at least in part, to differences in recovery behavior of the body diodes 211 and 213 of the level shifter 112, such as when the reset input pulse provided by the pulse generator 208 is logic 1 (i.e., the reset transistor 212 is switched on and conducting) and the set input pulse provided by the pulse generator 208 is logic 0 (i.e., the set transistor 210 is switched off and not conducting). Such an unwanted set control signal could cause both the high-side device (e.g., IGBT 115) and the low-side device (e.g., IGBT 135) to turn on at the same time, causing latch-on failure and potential catastrophic circuit damage (e.g., to the power semiconductor device pair and/or other elements of an associated power semiconductor circuit).

FIG. 3 is a schematic diagram of an edge-trigger 222 that can be implemented in the circuits of FIGS. 1 and 2, in accordance with an implementation. As shown in FIG. 3, the edge trigger 222 can include a first edge trigger circuit 300 that is configured to receive the noise filtered version of the reset input signal RD' from the noise canceller 220 and provide the reset signal R to the reset input of the SR latch 224. The edge trigger 222 shown in FIG. 3 also includes a second edge trigger circuit 305 (that is schematically equivalent with the edge trigger circuit 300). As shown in FIG. 3, the second edge trigger circuit 305 can be configured to receive the noise filtered version of the set input signal SD' from the noise canceller 220 and provide the set signal S to the set input of the SR latch 224. As the edge trigger circuits 300 and 205 are schematically equivalent, for the sake of brevity, they will be both described with reference to the edge trigger circuit 300.

As shown in FIG. 3, the edge trigger circuit 300 (and the edge trigger circuit 305) can include a non-inverting signal path and an inverting signal path that each provide a respective input signal to a NOR gate 360. The inverting path of the edge trigger circuit 300 includes, in this example, a single inverter 350. The non-inverting signal path includes a plurality (e.g., even number) of inverters 310 and 340 and a resistive-capacitive (RC) delay circuit, including a resistor 320 and a capacitor 330 that, in this example, is coupled between the inverters 310 and 340 (e.g., between an output terminal of the inverter 310 and an input terminal of the inverter 340). As also shown in FIG. 3, one terminal of the capacitor 330 can be coupled with the offset voltage supply terminal 230, which acts as a ground reference for the edge trigger 222, as was discussed above.

As the output of the NOR gate 360 will be logic 0, except when both of its inputs are logic 0, the reset signal R produced by the edge trigger circuit 300 (the output of the NOR gate 360) will change from logic 0 to logic 1 in response to a rising edge (a transition from logic 0 to logic 1) of the noise filtered version of the reset input signal RD' and remain logic 1 for a period of time that is equal to a difference in signal propagation delay between the non-inverting signal path and the inverting signal path, during a time when both inputs of the NOR gate are logic 0. As shown in the timing diagram in FIG. 4, because the rising edge of the reset input signal RD' and corresponding rising edge of the reset signal R produced by edge trigger circuit 300 correspond with the high-side output signal going to logic 0 (turning off the high-side IGBT 115 and starting the high-voltage recovery period) and the reset input pulse produced by the pulse generator 208 also going to logic 0, there is, consequently, no overlap between the reset input pulse and the high-voltage recovery period, preventing mismatch in reverse recovery charge between the body diodes 211 and 213 and, as a result, preventing latch-on failure.

FIG. 4 is a timing diagram illustrating signal timing and operation of the high-side drive circuit 110A of FIG. 2. Shown in the timing diagram of FIG. 4 are relative relationships of signals associated with operation of the circuit 110A, e.g., when implemented as the high-side drive circuit 110 of the circuit 100 and implemented using the edge trigger 222 shown in FIG. 3. The signals shown in FIG. 4 include the high-side input signal (HIN) that is applied to the terminal 105; the set input pulse produced by the pulse generator 208 in response to the rising edge of the HIN signal; and the reset input pulse produced by the pulse generator 208 in response to the falling edge of the HIN signal.

FIG. 4 also illustrates, using a single signal trace, the set input signal SD produced by the level shifter 212 and the noise filtered version of the set input signal SD' produced by the noise canceller 220, as well as, using another single signal trace, the reset input signal RD produced by the level shifter 212 and the noise filtered version of the reset input signal RD' produced by the noise canceller 220. As illustrated in FIG. 4, the two versions of the set input signal SD and SD' correspond with (e.g., are inverted versions of) the set input pulse. Likewise, the two versions of the reset input signal RD and RD' correspond with (e.g., are inverted versions of) the reset input pulse.

FIG. 4 also illustrates the set signal S (produced by the edge trigger 222) that is applied to the set input of the SR latch 224, and the reset signal R (produced by the edge trigger 222) that is applied to the reset input of the SR latch 224. As shown in FIG. 4 (and with further reference to FIGS. 2 and 3) the set signal S is produced (by the edge trigger 222) in response to the rising edge of the noise filtered set input signal SD' and the reset signal R is produced (by the edge trigger 222) in response to the rising edge of the reset input signal RD'.

Still further, FIG. 4 illustrates the high-side output signal (HO) that is applied to the terminal 114 by the driver 226. In this example implementation the HO signal will correspond with the output signal Q of the SR latch 226 (e.g., the HO signal will be a version of the signal Q that is produced by the driver 226). The timing diagram in FIG. 4 also illustrates the high-voltage recovery period of the circuit 110A when implemented in the circuit 100 (which begins after the falling edge of the HO signal) as the signal VB. As shown in FIG. 4, the timing of the circuit 110A prevents timing overlap between the reset input pulse and the high-voltage voltage recovery period of signal VB, which prevents both unwanted set input pulses from occurring and a resulting latch-on failure.

FIG. 5 is a block/schematic diagram of a high-side drive circuit 110B that can be implemented in the circuit 100 of FIG. 1, in accordance with an implementation. For instance, the circuit 110B, as with the circuit 110A shown in FIG. 2, can be implemented as the high-side drive circuit 110 of the circuit 100. Accordingly, for purposes of illustration, the circuit 110B will be described with further reference to FIG. 1 and like elements in FIGS. 1 and 5 are referenced with like reference numbers. For instance, as with the circuit 110A, the circuit 110B includes the high-side input terminal 105, the high-voltage supply terminal 120 and the high-side output terminal 114. The circuit 110B also includes an offset voltage supply terminal 530 that provides an offset voltage for operation of at least some of the components of the high-side driver circuit 110B, such as described herein.

In the circuit 110B, the input circuit 111 of the circuit 100 can be schematically equivalent with the input circuit of the high-side drive circuit 110A, and include a pull-down resistor 502 (e.g., as a biasing element), a Schmitt trigger 504, an input (noise) filter 506 and a pulse generator 508. As the input circuit of the circuit 110B is schematically equivalent with the input circuit of the circuit 110A, for purposes of brevity, the specific details discussed above with respect to the input circuit in FIG. 2 are not all repeated again here with respect to FIG. 5. It will be appreciated that, in some implementations, an input circuit having a different configuration than that shown in FIGS. 2 and 5 could be implemented in the circuit 100, the circuit 110A and/or the circuit 110B.

Also in the circuit 110A, the level shifter circuit 112 of the circuit 100 can be schematically equivalent with the input circuit of the high-side drive circuit 110A, and include a first (set) transistor 510 (with corresponding body diode 511) coupled with the pulse generator 508 and a second (reset) transistor 512 (with corresponding body diode 513) coupled with the pulse generator 508. In the circuit 110B, the level shifter circuit 112 of the circuit 100 can also include a first (set) pull-up resistor 514, a first transient blocking (zener) diode 515, a second (reset) pull-up resistor 516, and a second transient blocking (zener) diode 517. As the level shifter circuit of the circuit 110B is schematically equivalent with the level shifter circuit of the circuit 110A, for purposes of brevity, the specific details discussed above with respect to the level shifter in FIG. 2 are not all repeated again here with respect to FIG. 5. It will be appreciated that, in some implementations, a level shifter circuit having a different configuration could be implemented in the circuit 100, the circuit 110A and/or the circuit 110B.

When implemented with the circuit 110B, the high-side driver circuit 113 of the circuit 100 can include a noise canceller 520, a SR latch 524, a delay logic circuit (delay circuit) 550 (which acts as the overlap protection circuit in this example) and a signal buffer/driver 526. In the circuit 100, implemented with the circuit 110B as the high-side drive circuit 110, the level shifter 112 and the high-side driver 113, as shown in FIG. 5, are powered (operated by) a potential difference between the high-voltage supply terminal 120 and the offset voltage supply terminal 530, such as was discussed above with respect to, e.g., FIG. 2.

In the circuit 110B, the set transistor 510 can be configured, in conjunction with the set pull-up resistor 514, to generate a set input signal that is provided to the high-side driver 113, e.g., in the circuit 100, where the set input signal is produced by switching the set transistor 510 with a set input pulse produced by the pulse generator 508. The set input signal can (via the noise canceller 520) set the SR latch 524 (set the output Q of the SR latch 524 to logic 1 in response to a rising edge on the set input (S) of the SR latch 524), which will turn on (via the delay circuit 550) the high-side IGBT 115 in the circuit 100. In this example, the noise canceller 520 can invert the set input signal SD and the reset input signal RD produced by the level shifter to provide, respectively, the set signal S and the reset signal R for the SR latch 524. In other words, in this example, the set signal S and the reset signal R of the SR latch 524 are respective inverted version of the set input signal SD and the reset input signal RD in the circuit 110B.

Likewise, the reset transistor 512 of the circuit 110B can be configured to generate a reset input signal for the high-side driver 113, e.g., in the circuit 100, where the reset input signal is produced by switching the reset transistor 512 with a reset input pulse produced by the pulse generator 508. The reset input signal can (via the noise canceller 520) reset the SR latch 524 (set the output Q of the SR latch 524 to logic 0 in response to a rising edge on the reset input (R) of the SR latch 524), which will turn off (via the delay circuit 550) the high-side IGBT 115 in the circuit 100.

In the high-side drive circuit 110B, the delay circuit 550 can produce a delayed version Q' of the output signal Q of the SR latch 524, which can then be applied to the input of the driver 526 to produce a HO signal on the terminal 114 to control switching of the high-side IGBT 115 in the circuit 100. Use of the delay circuit 550 to produce the delayed version Q' of the of the output signal Q of the SR latch 224, as shown in the timing diagram of FIG. 7, prevents timing overlap between the reset input pulse provided to the level shifter 112 by the pulse generator 508 and a voltage-recovery period of the high-voltage supply terminal 120 (e.g., after the switching off the high-side IGBT 115). That is, the delay circuit 550 causes the high-side IGBT 115 to turn off (starting the high-voltage recovery period) after (or in alignment with) the falling edge of the reset input pulse, which turns of the set transistor 510, preventing timing overlap between the reset input pulse and the high-voltage recovery period and, accordingly, prevents associated latch-on failure.

Figure 6:
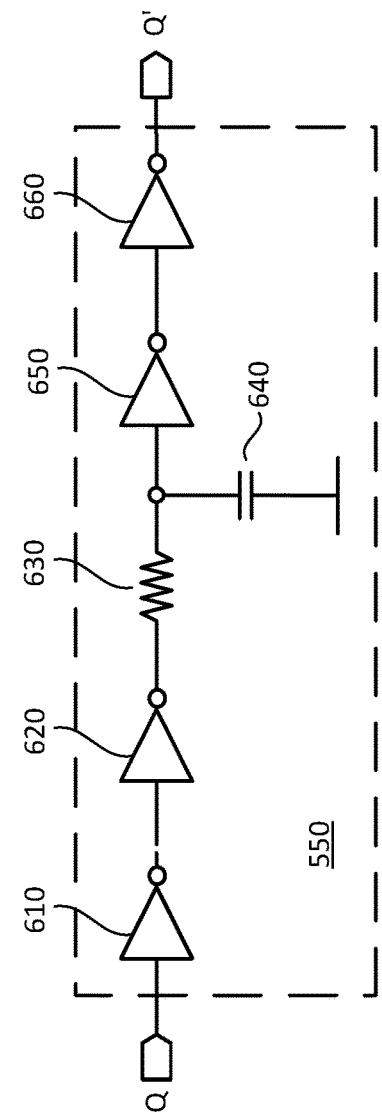
FIG. 6 is a schematic diagram of a delay circuit that can be implemented in the circuits of FIGS. 1 and 5, in accordance with an implementation.

FIG. 6 is a schematic diagram of a delay circuit 550 that can be implemented in the circuits of FIGS. 1 and 5, in accordance with an implementation. As shown in FIG. 6, the delay circuit 550 can be a non-inverting delay circuit that includes a plurality (e.g., even number) of inverters 610, 620, 650 and 660. In certain implementations, the delay circuit 550 could be an inverting delay circuit including, e.g., an odd number of inverters. The delay circuit 550 shown in FIG. 6 also includes a resistive-capacitive (RC) delay circuit, including a resistor 630 and a capacitor 640 that, in this example, is coupled between the inverters 620 and 650 (e.g., between an output terminal of the inventor 620 and an input terminal of the inverter 650). As also shown in FIG. 6, one terminal of the capacitor 640 can be coupled with the offset voltage supply terminal 530, which acts as a ground reference for the delay circuit 550, such as described herein with respect to the high-side driver circuit 113, for example.

Figure 7:
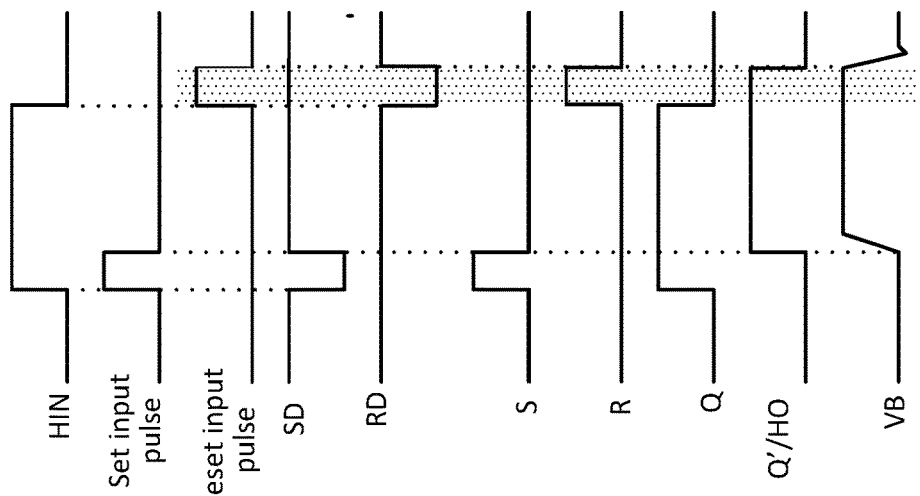
FIG. 7 is a timing diagram illustrating operation of the high-side drive circuit of FIG. 5.

FIG. 7 is a timing diagram illustrating signal timing and operation of the high-side drive circuit 110B of FIG. 5. Shown in the timing diagram of FIG. 7 are relative relationships of signals associated with operation of the circuit 110B, e.g., when implemented as the high-side drive circuit 110 of the circuit 100 and implemented using the delay circuit 550 shown in FIG. 6. The signals shown in FIG. 7 include the high-side input signal (HIN) that is applied to the terminal 105; the set input pulse produced by the pulse generator 508 in response to the rising edge of the HIN signal; and the reset input pulse produced by the pulse generator 508 in response to the falling edge of the HIN signal.

FIG. 7 also illustrates the set input signal SD produced by the set transistor 510 and the set signal S, which is a noise filtered, inverted version of the set input signal SD that is produced by the noise canceller 520. The timing diagram of FIG. 7 also shows the reset input signal RD produced by the level shifter 512 and the reset signal R, which is a noise filtered, inverted version of the reset input signal RD that is produced by the noise canceller 520.

FIG. 7 also illustrates the output signal Q of the SR latch 520 and, using a single signal trace, the delayed version Q' of the SR latch 524's output signal Q and the HO signal that is applied to the terminal 114 by the driver 526. As the signal propagation delay of the driver 526 should be negligible, any timing difference between the delayed version Q' of the SR latch 524's output signal Q and the HO signal should also be negligible. The timing diagram in FIG. 7 also illustrates the high-voltage recovery period of the circuit 110B when implemented in the circuit 100 (which begins after the falling edge of the HO signal) as the signal VB. As shown in FIG. 7, the timing of the circuit 110B prevents timing overlap between the reset input pulse and the high-voltage voltage recovery period of signal VB, which prevents unwanted set input pulses from being generated in the level shifter and, accordingly, also prevents resulting latch-on failure.

In a first example, an apparatus can include a low-side drive circuit configured to control a low-side device of a power semiconductor device pair; and a high-side drive circuit configured to control a high-side device of the power semiconductor device pair. The high-side drive circuit can include: an input circuit configured to: receive an input signal; and produce, based on the input signal, a first control signal and a second control signal. The high side drive circuit can also include a high-voltage circuit configured to: in response to the first control signal, provide a set signal to turn on the high-side device of the power semiconductor device pair; and in response to the second control signal, provide a reset signal to turn off the high-side device of the power semiconductor device pair. The high-voltage circuit can include an overlap-prevention circuit configured to prevent timing overlap between the second control signal and a voltage-recovery period of the high-voltage circuit, the voltage-recovery period occurring after turning off the high-side device of the power semiconductor device pair.

In a second example based on the first example, the apparatus can further include a level-shifter circuit coupled with the input circuit and the high-voltage circuit, the level-shifter circuit being configured to shift the first control signal and the second control signal from respective low-voltage signals to respective high-voltage signals.

In a third example based on any one of the first and second examples, the overlap-prevention circuit can include: a first edge-trigger circuit configured to receive a level-shifted version of the first control signal and provide the set signal based on one of a rising edge or a falling edge of the first control signal; and a second edge-trigger circuit configured to receive a level-shifted version of the second control signal and provide the reset signal based on one of a rising edge or a falling edge of the second control signal.

In a fourth example based on the third example, the apparatus can further include: a set-reset (SR) latch circuit; and a driver circuit coupled with an output of the SR latch circuit. The driver circuit can be configured to drive a control terminal of the high-side device of the power semiconductor device pair based on an output signal of the SR latch circuit. A set input of the SR latch circuit can be coupled with the first edge-trigger circuit to receive the set signal, and a reset input of the SR latch circuit can be coupled with the second edge-trigger circuit to receive the reset signal.

In a fifth example based on any one of the third and fourth examples, at least one of the first edge-trigger circuit or the second edge-trigger circuit can include: an inverted signal path; a non-inverted signal path that includes an RC delay circuit, such that a signal provided by the non-inverted signal path is delayed with respect to a signal provided by the inverted signal path. The at least one of the first edge-trigger circuit or the second edge-trigger circuit can also include a NOR logic gate having a first input coupled with the inverted signal path and a second input coupled with the non-inverted signal path.

In a sixth example based on any one of the first and second examples, the overlap prevention circuit can include a delay circuit, and the apparatus can further include: a set-reset (SR) latch circuit, an output of the of the SR latch circuit being coupled with an input of the delay circuit, a set input of the SR latch circuit being configured to receive a level-shifted version of the first control signal, and a reset input of the SR latch circuit being configured to receive a level-shifted version of the second control signal. The apparatus can further include a driver circuit coupled with an output of the delay circuit, the driver circuit being configured to drive a control terminal of the high-side device of the power semiconductor device pair based on an output signal of the SR latch circuit delayed by the delay circuit.

In a seventh example based on the sixth example, the delay circuit can include: a plurality of inverters connected in series; and a RC delay circuit coupled between an output of a first inverter of the plurality of inverters and an input of a second inverter of the plurality of inverters, the output of the first inverter being further coupled with the input of the second inverter.

In an eighth example based on the sixth example, the delay circuit can be a non-inverting delay circuit.

In a ninth example, based on any one of the previous examples, the input circuit can include a pulse generator circuit configured to generate the first control signal and the second control signal based on the input signal.

The various apparatus and techniques described herein may be implemented using various semiconductor processing and/or packaging techniques. Some embodiments may be implemented using various types of semiconductor processing techniques associated with semiconductor substrates including, but not limited to, for example, Silicon (Si), Galium Arsenide (GaAs), Galium Nitride (GaN), Silicon Carbide (SiC), and/or so forth.

Implementations of the various techniques described herein may be implemented in digital electronic circuitry, or in computer hardware, firmware, software, or in combinations of them. Implementations may be implemented as a computer program product, i.e., a computer program tangibly embodied in an information carrier, e.g., in a machine-readable storage device, for execution by, or to control the operation of, data processing apparatus, e.g., a programmable processor, a computer, or multiple computers. A computer program, such as the computer program(s) described above, can be written in any form of programming language, including compiled or interpreted languages, and can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps (e.g., providing logic signals) may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An apparatus, comprising:
   a low-side drive circuit configured to control a low-side device of a power semiconductor device pair; and
   a high-side drive circuit configured to control a high-side device of the power semiconductor device pair, the high-side drive circuit including:
      an input circuit configured to:
         receive an input signal; and
         produce, based on the input signal, a first control signal and a second control signal;
      a high-voltage circuit configured to:
         in response to the first control signal, provide a set signal to turn on the high-side device of the power semiconductor device pair; and
         in response to the second control signal, provide a reset signal to turn off the high-side device of the power semiconductor device pair,
      the high-voltage circuit including an overlap-prevention circuit configured to prevent timing overlap between the second control signal and a voltage-recovery period of the high-voltage circuit, the voltage-recovery period occurring after turning off the high-side device of the power semiconductor device pair.

2. The apparatus of claim 1, further comprising a level-shifter circuit coupled with the input circuit and the high-voltage circuit, the level-shifter circuit being configured to shift the first control signal and the second control signal from respective low-voltage signals to respective high-voltage signals.

3. The apparatus of claim 1, wherein the overlap-prevention circuit includes:
   a first edge-trigger circuit configured to receive a level-shifted version of the first control signal and provide the set signal based on one of a rising edge or a falling edge of the first control signal; and
   a second edge-trigger circuit configured to receive a level-shifted version of the second control signal and provide the reset signal based on one of a rising edge or a falling edge of the second control signal.

4. The apparatus of claim 3, further comprising:
   a set-reset (SR) latch circuit; and
   a driver circuit coupled with an output of the SR latch circuit, the driver circuit being configured to drive a control terminal of the high-side device of the power semiconductor device pair based on an output signal of the SR latch circuit,
   a set input of the SR latch circuit being coupled with the first edge-trigger circuit to receive the set signal,
   a reset input of the SR latch circuit being coupled with the second edge-trigger circuit to receive the reset signal.

5. The apparatus of claim 3, wherein at least one of the first edge-trigger circuit or the second edge-trigger circuit includes:

an inverted signal path;
a non-inverted signal path that includes an RC delay circuit, such that a signal provided by the non-inverted signal path is delayed with respect to a signal provided by the inverted signal path; and
a NOR logic gate having a first input coupled with the inverted signal path and a second input coupled with the non-inverted signal path.

6. The apparatus of claim 1, wherein the overlap prevention circuit includes a delay circuit, the apparatus further comprising:
a set-reset (SR) latch circuit,
an output of the of the SR latch circuit being coupled with an input of the delay circuit,
a set input of the SR latch circuit being configured to receive a level-shifted version of the first control signal, and
a reset input of the SR latch circuit being configured to receive a level-shifted version of the second control signal; and
a driver circuit coupled with an output of the delay circuit, the driver circuit being configured to drive a control terminal of the high-side device of the power semiconductor device pair based on an output signal of the SR latch circuit delayed by the delay circuit.

7. The apparatus of claim 6, wherein the delay circuit includes:
a plurality of inverters connected in series; and
a RC delay circuit coupled between an output of a first inverter of the plurality of inverters and an input of a second inverter of the plurality of inverters, the output of the first inverter being further coupled with the input of the second inverter.

8. The apparatus of claim 6, wherein the delay circuit is a non-inverting delay circuit.

9. The apparatus of claim 1, wherein the input circuit includes a pulse generator circuit configured to generate the first control signal and the second control signal based on the input signal.

10. An apparatus, comprising:
a low-side drive circuit configured to control a low-side device of a power semiconductor device pair; and
a high-side drive circuit configured to control a high-side device of the power semiconductor device pair, the high-side drive circuit including:
an input circuit configured to:
receive an input signal; and
produce, based on the input signal, a first control signal and a second control signal;
a high-voltage circuit including:
an edge-trigger circuit configured to receive a version of the second control signal and provide a reset signal based on one of a rising edge or a falling edge of the second control signal;
a set-reset (SR) latch circuit; and
a driver circuit coupled with an output of the SR latch circuit, the driver circuit being configured to drive a control terminal of the high-side device of the power semiconductor device pair based on an output signal of the SR latch circuit,
a set input of the SR latch circuit being configured to receive a set signal that is based on the first control signal,
a reset input of the SR latch circuit being coupled with the edge-trigger circuit to receive the reset signal.

11. The apparatus of claim 10, further comprising a level-shifter circuit coupled with the input circuit and the high-voltage circuit, the level-shifter circuit being configured to shift the first control signal and the second control signal from respective low-voltage signals to respective high-voltage signals.

12. The apparatus of claim 10, wherein the edge-trigger circuit includes:
an inverted signal path;
a non-inverted signal path that includes a RC delay circuit, such that a signal provided by the non-inverted signal path is delayed with respect to a signal provided by the inverted signal path; and
a NOR logic gate having a first input coupled with the inverted signal path and a second input coupled with the non-inverted signal path.

13. The apparatus of claim 10, wherein the input circuit includes a pulse generator circuit configured to generate the first control signal and the second control signal based on the input signal.

14. The apparatus of claim 10, wherein the edge-trigger circuit is a first edge-trigger circuit, the apparatus further including a second edge-trigger circuit configured to receive a version of the first control signal and provide the set signal based on one of a rising edge or a falling edge of the first control signal.

15. The apparatus of claim 14, wherein the second edge-trigger circuit includes:
an inverted signal path;
a non-inverted signal path that includes a RC delay circuit, such that a signal provided by the non-inverted signal path is delayed with respect to a signal provided by the inverted signal path; and
a NOR logic gate having a first input coupled with the inverted signal path and a second input coupled with the non-inverted signal path.

16. An apparatus, comprising:
a low-side drive circuit configured to control a low-side device of a power semiconductor device pair; and
a high-side drive circuit configured to control a high-side device of the power semiconductor device pair, the high-side drive circuit including:
an input circuit configured to:
receive an input signal; and
produce, based on the input signal, a first control signal and a second control signal;
a high-voltage circuit including:
a set-reset (SR) latch circuit,
a set input of the SR latch circuit being configured to receive a version of the first control signal, and
a reset input of the SR latch circuit being configured to receive a version of the second control signal;
a delay circuit, an output of the of the SR latch circuit being coupled with an input of the delay circuit; and
a driver circuit coupled with an output of the delay circuit, the driver circuit being configured to drive a control terminal of the high-side device of the power semiconductor device pair based on an output signal of the SR latch circuit delayed by the delay circuit.

17. The apparatus of claim 16, wherein the delay circuit includes:
a plurality of inverters connected in series; and
a RC delay circuit coupled between an output of a first inverter of the plurality of inverters and an input of a second inverter of the plurality of inverters, the output of the first inverter being further coupled with the input of the second inverter.

18. The apparatus of claim 16, wherein the delay circuit is a non-inverting delay circuit.

19. The apparatus of claim 16, further comprising a level-shifter circuit coupled with the input circuit and the high-voltage circuit, the level-shifter circuit being configured to shift the first control signal and the second control signal from respective low-voltage signals to respective high-voltage signals.

20. The apparatus of claim 16, wherein the input circuit includes a pulse generator circuit configured to generate the first control signal and the second control signal based on the input signal.

* * * * *